(12) United States Patent
Kim et al.

(10) Patent No.: US 10,750,112 B2
(45) Date of Patent: Aug. 18, 2020

(54) SUBSTRATE STRUCTURES FOR IMAGE SENSOR MODULES AND IMAGE SENSOR MODULES INCLUDING THE SAME

(71) Applicant: Samsung Electronics Co., Ltd., Suwon-si, Gyeonggi-do (KR)

(72) Inventors: Ji-Hwang Kim, Cheonan-si (KR); Hyo-Eun Kim, Busan (KR); Jong-Bo Shim, Asan-si (KR); Cha-Jea Jo, Yongin-si (KR); Sang-Uk Han, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/129,010

(22) Filed: Sep. 12, 2018

(65) Prior Publication Data
US 2019/0174087 A1 Jun. 6, 2019

(30) Foreign Application Priority Data
Dec. 5, 2017 (KR) .......................... 10-2017-0165701

(51) Int. Cl.
*H04N 5/369* (2011.01)
*H04N 5/225* (2006.01)
*G02B 5/20* (2006.01)
*H01L 27/146* (2006.01)

(52) U.S. Cl.
CPC ............... *H04N 5/379* (2018.08); *G02B 5/20* (2013.01); *H01L 27/14618* (2013.01); *H01L 27/14625* (2013.01); *H04N 5/2253* (2013.01); *H04N 5/2254* (2013.01)

(58) Field of Classification Search
CPC .... H04N 5/379; H04N 5/2254; H04N 5/2253; G02B 5/20; H01L 27/14618; H01L 27/14625
See application file for complete search history.

(56) References Cited

U.S. PATENT DOCUMENTS

| 7,299,988 | B2 | 11/2007 | Kitada | |
|---|---|---|---|---|
| 2004/0095501 | A1* | 5/2004 | Aizawa | H01L 27/14618 348/340 |
| 2005/0285016 | A1* | 12/2005 | Kong | H01L 27/14618 250/208.1 |
| 2006/0017128 | A1* | 1/2006 | Harazono | H01L 27/14618 257/433 |

(Continued)

FOREIGN PATENT DOCUMENTS

| JP | 4411893 B2 | 2/2010 |
|---|---|---|
| JP | 4849703 B2 | 1/2012 |

(Continued)

*Primary Examiner* — Abdelaaziz Tissire
(74) *Attorney, Agent, or Firm* — Harness, Dickey & Pierce, P.L.C.

(57) ABSTRACT

A substrate structure for an image sensor module includes a module substrate including a sensor mounting hole, a reinforcing plate on a lower surface of the module substrate, an image sensor chip on the reinforcing plate within the sensor mounting hole, and a reinforcing pattern in the module substrate. The reinforcing plate covers the sensor mounting hole. An upper surface of the image sensor chip may be exposed by the module substrate. The reinforcing pattern is adjacent to the sensor mounting hole and extends in at least one direction.

18 Claims, 13 Drawing Sheets

(56) References Cited

U.S. PATENT DOCUMENTS

| | | | |
|---|---|---|---|
| 2006/0234767 A1 | 10/2006 | Nishikawa et al. | |
| 2009/0141165 A1* | 6/2009 | Nakamura | H04N 5/2252 |
| | | | 348/374 |
| 2010/0013041 A1 | 1/2010 | Bolt | |
| 2012/0276951 A1* | 11/2012 | Webster | H05K 1/021 |
| | | | 455/556.1 |
| 2012/0318960 A1* | 12/2012 | Ha | H01L 27/14618 |
| | | | 250/208.1 |
| 2016/0260756 A1 | 9/2016 | Yamagishi | |
| 2017/0104022 A1* | 4/2017 | Okamura | H05K 3/4697 |

FOREIGN PATENT DOCUMENTS

| | | | |
|---|---|---|---|
| JP | 2016219616 A | * | 12/2016 |
| KR | 20060003887 A | | 1/2006 |
| KR | 20080051445 A | | 6/2008 |
| KR | 10-1142347 B1 | | 7/2012 |
| KR | 10-1619045 B1 | | 5/2016 |
| KR | 20170037555 A | | 4/2017 |

* cited by examiner

SUBSTRATE STRUCTURES FOR IMAGE SENSOR MODULES AND IMAGE SENSOR MODULES INCLUDING THE SAME

CROSS-REFERENCE TO RELATED APPLICATION

This application claims priority under 35 U.S.C. § 119 to Korean Patent Application No. 10-2017-0165701, filed on Dec. 5, 2017 in the Korean Intellectual Property Office (KIPO), the contents of which are herein incorporated by reference in their entirety.

BACKGROUND

1. Field

Some example embodiments relate to substrate structures for image sensor modules and said image sensor modules. More particularly, some example embodiments relate to substrate structures for mounting an image sensor chip and image sensor modules including the same.

2. Description of the Related Art

Recently, high resolution image sensor modules have been widely used in digital devices such as digital cameras, camera phones, etc. An image sensor module may include an image sensor chip that is configured to convert image information (e.g., information associated with light incident on the image sensor chip) into electrical information. The image sensor chip may be mounted on a module substrate to at least partially form a substrate structure, and then, the substrate structure may be assembled into a digital device. When the digital device is assembled, the module substrate may be deformed and damaged due to a force exerted on a lower surface of the module substrate, thereby causing the image sensor module to have poor sensitivity (e.g., poor capability to convert image information into electrical information with accuracy and precision).

SUMMARY

Some example embodiments provide a substrate structure for an image sensor module, where the substrate structure has a structure configured to improve a backside strength of the substrate structure without implementing structural changes to the substrate structure.

Some example embodiments provide an image sensor module including the substrate structure.

According to some example embodiments, a substrate structure for an image sensor module may include a module substrate that itself includes a sensor mounting hole. The substrate structure may further include a reinforcing plate on a lower surface of the module substrate, where the reinforcing plate covers the sensor mounting hole. The substrate structure may further include an image sensor chip on the reinforcing plate within the sensor mounting hole, such that an upper surface of the image sensor chip is exposed by the module substrate, and a reinforcing pattern in the module substrate. The reinforcing pattern may be adjacent to the sensor mounting hole and may extend in at least one direction.

According to some example embodiments, a substrate structure for an image sensor module may include a module substrate having an upper surface and a lower surface, where the module substrate includes a sensor mounting hole. The substrate structure may further include a reinforcing plate on a lower surface of the module substrate, where the reinforcing plate covers the sensor mounting hole. The substrate structure may further include an image sensor chip on the reinforcing plate within the sensor mounting hole, such that an upper surface of the image sensor chip is exposed by the module substrate. The substrate structure may further include a reinforcing pattern in at least a portion of the module substrate. The reinforcing pattern may extend around the sensor mounting hole.

According to some example embodiments, an image sensor module may include a module substrate having an upper surface and a lower surface, where the module substrate includes a sensor mounting hole. The image sensor module may further include a reinforcing plate on a lower surface of the module substrate, where the reinforcing plate covers the sensor mounting hole. The image sensor module may further include an image sensor chip on the reinforcing plate within the sensor mounting hole, such that an upper surface of the image sensor chip is exposed by the module substrate. The image sensor module may further include a reinforcing pattern in at least a portion of the module substrate, where the reinforcing pattern extends within the module substrate around the sensor mounting hole. The image sensor module may further include an optical system on the upper surface of the module substrate, where the optical system is configured to focus light received from an external object to the image sensor chip.

According to some example embodiments, a substrate structure for image sensor module may include a module substrate having a sensor mounting hole, a reinforcing plate mounted on a lower surface of the module substrate to cover the sensor mounting hole, and a reinforcing pattern provided in the module substrate adjacent to the sensor mounting hole and extending in at least one direction. The reinforcing pattern may support a portion of the module substrate around the sensor mounting hole which is vulnerable to deformation when assembled for an electronic device, to thereby improve a backside strength of the module substrate.

Accordingly, deformations of the module substrate and the reinforcing plate may be minimized, thereby improving performance of the image sensor module and a device in which the module is incorporated, without structural changes of the image sensor module.

BRIEF DESCRIPTION OF THE DRAWINGS

Example embodiments will be more clearly understood from the following detailed description taken in conjunction with the accompanying drawings.

FIG. 1 is a cross-sectional view illustrating an image sensor module in accordance with some example embodiments.

FIG. 2 is a plan view illustrating the image sensor chip on a module substrate in FIG. 1.

FIGS. 3 and 4 are cross-sectional views illustrating a reinforcing pattern formed in the module substrate in accordance with some example embodiments.

FIGS. 5, 6, 7, and 8 are plan views illustrating a reinforcing pattern in accordance with some example embodiments.

FIG. 9 is a cross-sectional view illustrating an image sensor module in accordance with some example embodiments.

FIG. 10 is a plan view illustrating an image sensor chip on a module substrate in FIG. 9.

FIG. 11 is a cross-sectional view illustrating an image sensor module in accordance with some example embodiments.

FIG. 12 is a plan view illustrating an image sensor chip on a module substrate in FIG. 11.

FIG. 13 is a cross-sectional view illustrating an image sensor module in accordance with some example embodiments.

FIG. 14 is a plan view illustrating an image sensor chip on a module substrate in FIG. 13.

DETAILED DESCRIPTION OF EXAMPLE EMBODIMENTS

Hereinafter, example embodiments will be explained in detail with reference to the accompanying drawings.

Figure 1:
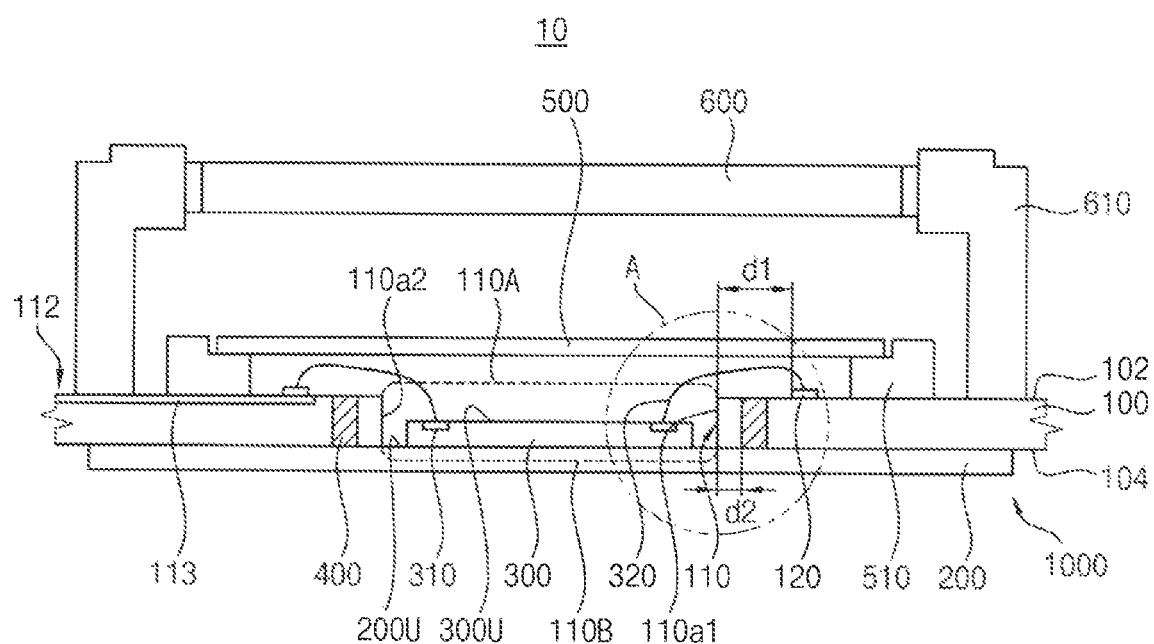
FIGS. 1 to 14 represent non-limiting, example embodiments as described herein.
Figure 2:
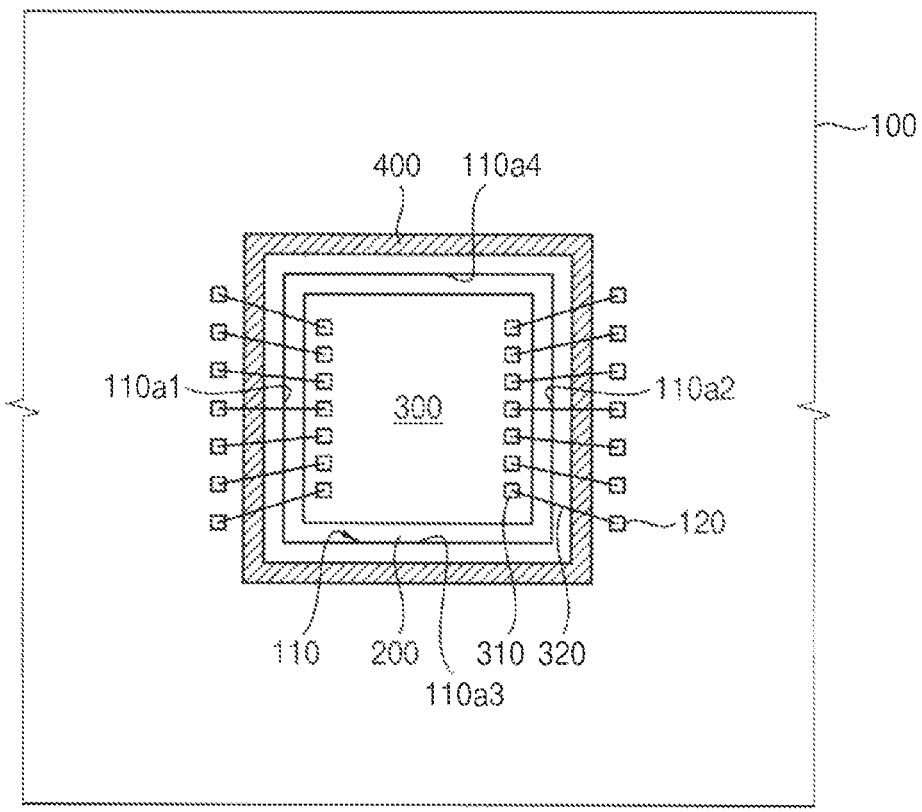
Figure 3:
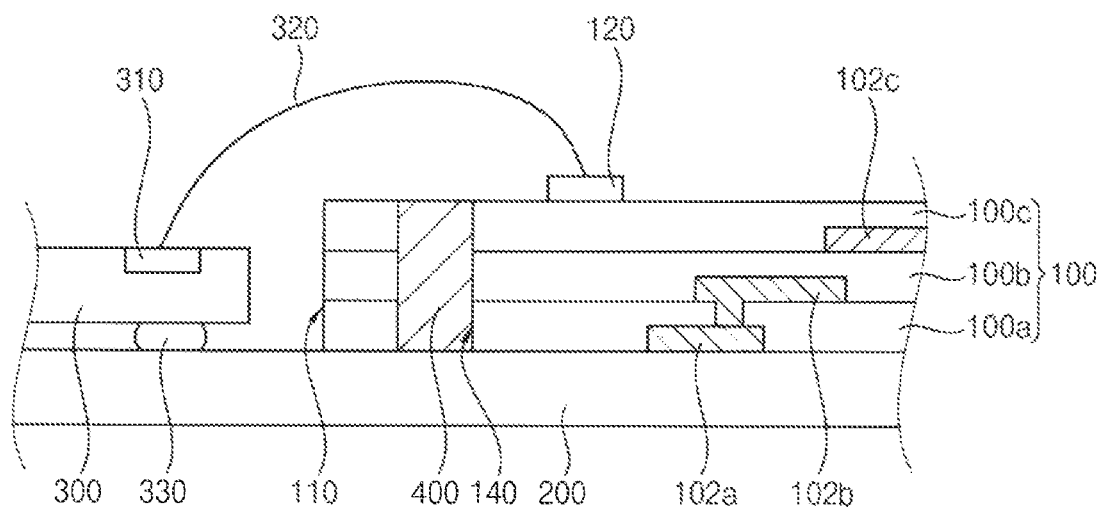
Figure 4:
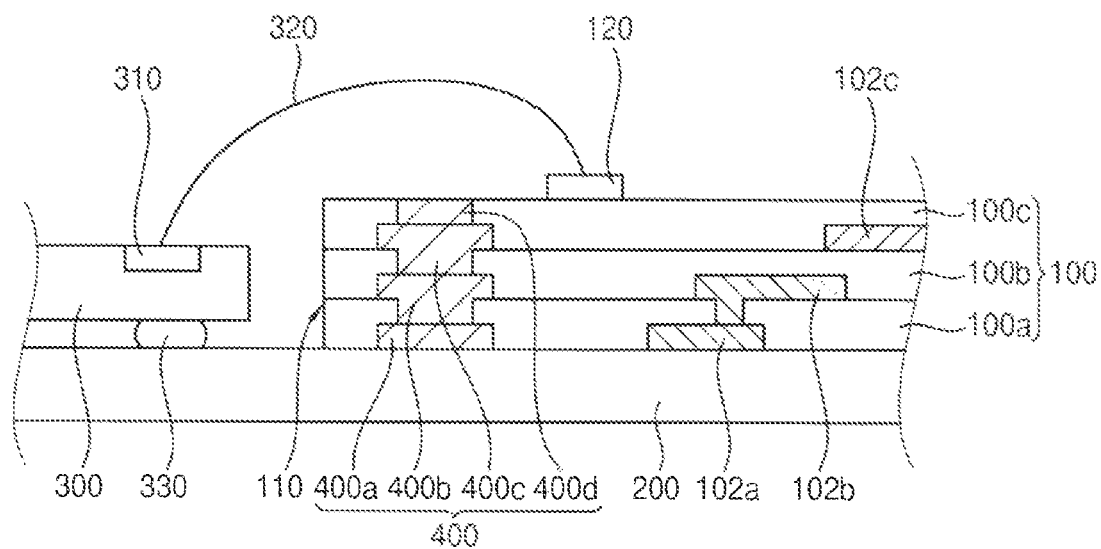

FIG. 1 is a cross-sectional view illustrating an image sensor module in accordance with some example embodiments. FIG. 2 is a plan view illustrating the image sensor chip on a module substrate in FIG. 1. FIGS. 3 and 4 are cross-sectional views of region 'A' of FIG. 1, FIGS. 3 and 4 illustrating a reinforcing pattern formed in the module substrate in accordance with some example embodiments.

Referring to FIGS. 1 to 4, an image sensor module 10 may include a substrate structure 1000 on which an image sensor chip 300 is mounted and an optical system 600 provided on the substrate structure 1000. The substrate structure 1000 may include a module substrate 100 having ("including") a sensor mounting hole 110 therein, a reinforcing plate 200 mounted on a lower surface of the module substrate 100 such that the reinforcing plate 200 covers a lower opening 110B of the sensor mounting hole 110, the image sensor chip 300 mounted on the reinforcing plate 200 within the sensor mounting hole 110 such that an upper surface 300U of the image sensor chip 300 is exposed thorough the upper opening 110U of the sensor mounting hole 110 by the module substrate 100, and a reinforcing pattern 400 extending in the module substrate 100 to at least partially surround the sensor mounting hole 110. The reinforcing pattern 400 is within the module substrate and is adjacent to the sensor mounting hole 110 and extends in at least one direction.

In example embodiments, the module substrate 100 may have an upper surface 102 and the lower surface 104, and the sensor mounting hole 110 may be formed to penetrate through the module substrate 100. The module substrate 100 may include a wiring layer 112 including a plurality of wirings 113 configured to enable electrical connection between the image sensor chip 300 and an external device. Although it is not illustrated in the figures, electronic devices such as a resistor, a capacitor, etc. may be mounted on the module substrate 100.

For example, the sensor mounting hole 110 may be formed in the middle portion of the module substrate 100. The sensor mounting hole 110 may have a rectangle shape corresponding to the image sensor chip 300.

The reinforcing plate 200 may be mounted on the lower surface 104 of the module substrate 100. The reinforcing plate 200 may be adhered to the lower surface 104 of the module substrate 100 to cover the sensor mounting hole 110. The reinforcing plate 200 may include a thermal conductive material. For example, the reinforcing plate 200 may include copper (Cu), silver (Ag), gold (Au), aluminum (Al), etc. The reinforcing plate 200 may have a thermal conductivity of from about 150 W/mK to about 300 W/mK.

The reinforcing plate 200 may include a single plate or a plurality of plates. The plurality of plates may include same or different metal materials.

The reinforcing plate 200 may have a particular (or, alternatively, predetermined) size. For example, the reinforcing plate 200 may cover only the sensor mounting hole 110 or the entire lower surface of the module substrate 100. The size of the reinforcing plate 200 may be determined in consideration of the heat dissipation performance, the strength reinforcement, costs, etc.

The image sensor chip 300 may be disposed within the sensor mounting hole 110. The image sensor chip 300 may be mounted on the upper surface 200U of the reinforcing plate 200 which is exposed through the sensor mounting hole 110. The image sensor chip 300 may be adhered to the upper surface 200U of the reinforcing plate 200 by an adhesive member 330 such as epoxy resin. Accordingly, and as shown in at least FIG. 1, an upper surface 300U of the image sensor chip 300 may be positioned lower than the upper surface 102 of the module substrate 100. Restated, the upper surface 300U of the image sensor chip 300 may be proximate to the reinforcing plate 200, in relation to the upper surface 102 of the module substrate 100.

For example, the image sensor chip 300 may include CMOS (Complementary Metal Oxide Semiconductor) image sensor. The CMOS image sensor (CIS) may include an active pixel region for picking up an image and a CMOS logic region for controlling an output signal of the active pixel region. The pixel region may include a photodiode and a MOS transistor, and the CMOS logic region may include a plurality of CMOS transistors.

The image sensor chip 300 may be electrically connected to the module substrate 100. For example, the image sensor chip 300 may be electrically connected to the module substrate 100. As shown in at least FIGS. 1 to 4, a plurality of chip pads 310 may be formed on an active surface of the image sensor chip 300, and a plurality of substrate pads 120 may be formed on the upper surface 102 of the module substrate 100, such that the substrate pads 120 extend along one or more sidewalls of the sensor mounting hole 110 and are configured to be electrically connected to the image sensor chip 300. The chip pads 310 may be connected to the substrate pads 120 of the module substrate 100 by a plurality of bonding wires 320 respectively. Accordingly, the image sensor chip 300 may be electrically connected to the module substrate 100 by the bonding wires 320.

In example embodiments, the image sensor module 10 may further include an optical filter 500 disposed over the image sensor chip 300. Restated, the optical filter 500 may extend over the module substrate 100 such that the optical filter 500 covers the image sensor chip 300 (e.g., from a plan view, for example as shown in at least FIG. 1). The optical filter 500 may include an IR (infrared rays) sensor. The optical filter 500 may be supported on the module substrate 100 by a bracket 510.

The bracket 510 may be arranged ("may extend") around the sensor mounting hole 110. The bracket 510 may a shape corresponding to the shape of the image sensor chip 300. When viewed in a plan view, the image sensor chip 300 may be arranged inside the bracket 510. The bracket 510 may be arranged to be further from the middle position of the sensor mounting hole than the substrate pads 120.

The bracket 510 may extend upwardly from the module substrate 100. The optical filter 500 may be supported fixedly in an upper portion of the bracket 510. Restated, the bracket 510 may be configured to support fixedly the optical filter, such that the optical filter is fixed in place in relation to at least the module substrate 100. Accordingly, the optical filter 500 may be arranged over the image sensor chip 300 by the bracket 510 to cover the image sensor chip 300.

In example embodiments, the optical system 600 may be arranged over the image sensor chip 300 to guide light from an object (e.g., light received from an external and/or remotely-located object) to the image sensor chip 300. A housing 610 may be adhered to the upper surface 102 of the module substrate 100 to support the optical system 600. The optical system 600 may include a lens and a lens barrel for adjusting the lens. Accordingly, the optical system 600 may focus the light from the object on the image sensor chip 300. Restated, the optical system 600 may be on an upper surface 102 of the module substrate 100 and may be configured to guide ("focus") light received from an external object to the image sensor chip 300, such that some, all, or substantially all (e.g., all within manufacturing tolerances and/or material tolerances) of the light, within one or more particular wavelength spectra of light (e.g., one or more infrared wavelength spectra, near-infrared wavelength spectra, visible wavelength spectra, ultraviolet wavelength spectra, some combination thereof, or the like), is focused to be incident on the image sensor chip 300.

Since the image sensor chip 300 is disposed within the sensor mounting hole 110 of the module substrate 100, a required distance between the optical system 600 and the image sensor chip 300, that is, a required back focal length may be guaranteed and the height of the optical system 600 from the module substrate 100 may be decreased. Thus, the total height of the image sensor module 10 may be decreased to thereby provide a very thin digital camera.

Further, the reinforcing plate 200 may be adhered to the lower surface 104 of the module substrate 100 and the image sensor chip 300 may be adhered to the reinforcing plate 200. The reinforcing plate 200 may efficiently dissipate heat from the image sensor chip 300, thereby enhancing the heat dissipating performance of the image sensor module 10.

The reinforcing pattern 400 may be formed in the module substrate 100 adjacent to the sensor mounting hole 110 to extend in at least one direction. As illustrated in FIG. 2, the sensor mounting hole 110 may have a rectangle or square shape, and the reinforcing pattern 400 may have a ring shape extending around the sensor mounting hole 110 within the module substrate 100.

A plurality of chip pads 310 may be arranged along first and second side portions opposite to each other on the active surface of the image sensor chip 300, and the plurality of substrate pads 120 may be arranged on the upper surface 102 of the module substrate 100 along first and second sidewalls 110a1 and 110a2 of the sensor mounting hole 110 corresponding to the respective chip pads 310.

As shown in at least FIG. 1, the substrate pad 120 may be spaced apart from a sidewall (e.g., first sidewall 110a1) of the sensor mounting hole 110 (e.g., isolated from direct contact with the sidewall of the sensor mounting hole 110) by a first distance d1, and the reinforcing pattern 400 may be spaced apart from the sidewall (e.g., first sidewall 110a1) of the sensor mounting hole 110 (e.g., isolated from direct contact with the sidewall of the sensor mounting hole 110) by a second distance d2 that is less than the first distance d1. That is, the substrate pad 120 may be arranged to be further from the sidewall (e.g., first sidewall 110a1) of the sensor mounting hole 110 than the reinforcing pattern 400.

The reinforcing pattern 400 may be formed in at least portion of the module substrate 100. For example, the reinforcing pattern 400 may be formed to penetrate through the module substrate 100. As illustrated in FIG. 3, the reinforcing pattern 400 may be formed in a through hole 140 which penetrates through the module substrate 100. The through hole 140 may be formed to penetrate through first to third wiring layers 100a, 100b, 100c of the module substrate 100, and then, the through hole 140 may be filled with a metal material to form the reinforcing pattern 400. Thus, the reinforcing pattern 400 may be in a through hole 140 which extends through the module substrate 100, such that the reinforcing pattern 400 extends through the module substrate 100. For example, the reinforcing pattern 400 may include the metal material such as copper (Cu), aluminum (Al), etc.

As illustrated in FIG. 4, the reinforcing pattern 400 may include a plurality of stacked reinforcing patterns 400a, 400b, 400c, 400d formed in a wiring layer of the module substrate 100. For example, the wiring layer may include at least first to third wiring layers 100a, 100b, 100c, and the reinforcing pattern 400 may include first to fourth reinforcing patterns 400a, 400b, 400c, 400d stacked vertically in the wring layer. The first to fourth reinforcing patterns 400a, 400b, 400c, 400d may be formed together when circuit wirings 102a, 102b, 102c are formed in the first to third wiring layers 100a, 100b, 100c. The reinforcing pattern 400 may include a metal material the same as the circuit wiring. Restated, the reinforcing pattern 400 and a wiring of the module substrate 100 may include a common material. In some example embodiments, the reinforcing pattern 400 and a wiring of the module substrate 100 may include different materials. The stacked reinforcing patterns 400a, 400b, 400c, 400d may be referred to herein as a plurality of stacked wiring patterns in a wiring layer of the module substrate 100.

As mentioned above, the reinforcing pattern 400 may be formed in the module substrate 100 around the sensor mounting hole 110 of the module substrate 100 which is vulnerable to deformation when a substrate structure 1000 is assembled for an electronic device such as a camera phone, to thereby improve a backside strength.

Accordingly, the reinforcing pattern may be formed in the module substrate without structural changes of the image sensor module, to thereby minimize deformations of the module substrate and the reinforcing plate.

FIGS. 5 to 8 are plan views illustrating a reinforcing pattern in accordance with some example embodiments.

Figure 5:
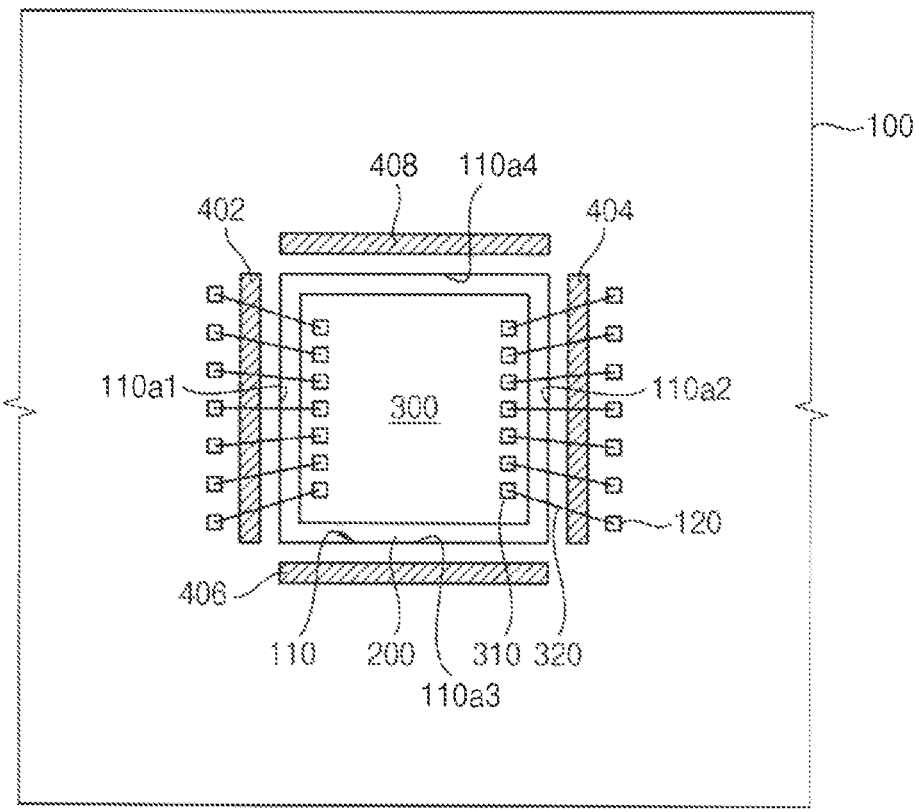

Referring to FIG. 5, a reinforcing pattern may include first to fourth support patterns 402, 404, 406, 408 which are spaced apart from each other along an entirety of a perimeter of the sensor mounting hole 110, such that the first to fourth support patterns 402, 404, 406, 408 are isolated from direct contact with each other. The first support pattern 402 may extend along a first sidewall 110a1 of the sensor mounting hole 110. The second support pattern 404 may extend along a second sidewall 110a2 of the sensor mounting hole 110 opposite to the first sidewall 110a1. Restated, at least the first and second support patterns 402 and 404 may comprise a pair of support patterns that extend within opposing first and second sidewalls of the sensor mounting hole 110, respectively. The third support pattern 406 may extend along a third sidewall 110a3 of the sensor mounting hole 110 adjacent to the first sidewall 110a1. The fourth support pattern 408 may extend along a fourth sidewall 110a4 of the sensor mounting hole 110 opposite to the third sidewall.

Figure 6:
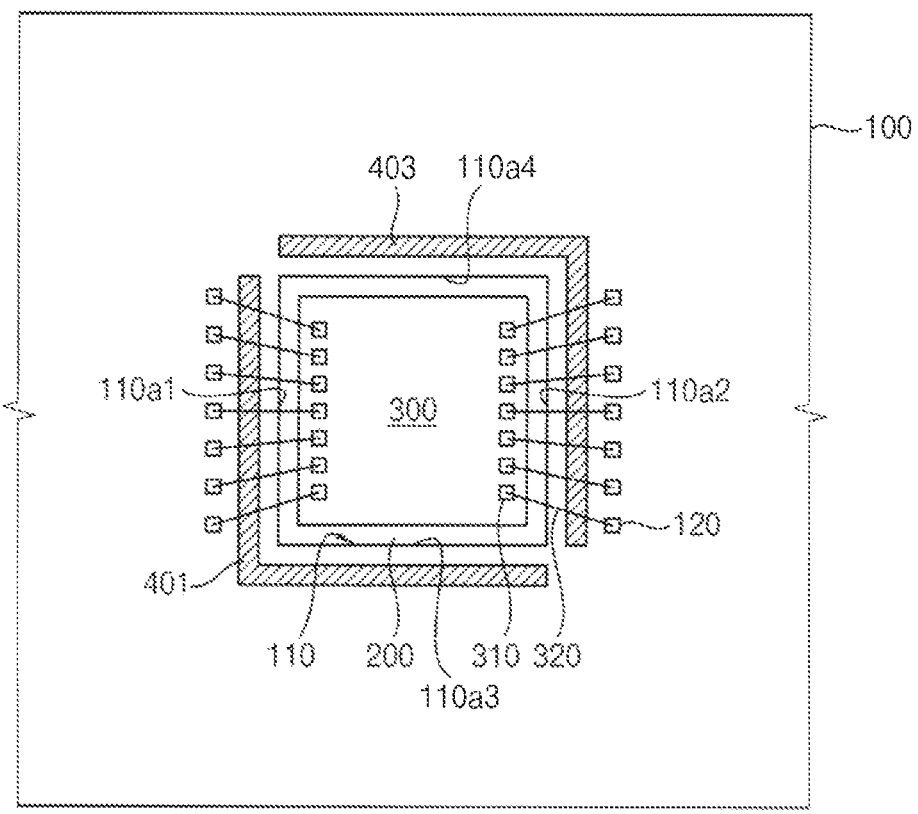

Referring to FIG. 6, a reinforcing pattern may include fifth and sixth support patterns 401, 403 which are spaced apart from each other along a perimeter of the sensor mounting hole 110. The fifth support pattern 401 may extend along a first sidewall 110a1 of the sensor mounting hole 110 and a third sidewall 110a3 of the sensor mounting hole 110 adjacent to the first sidewall 110a1. The sixth support pattern 403 may extend along a second sidewall 110a2 of the sensor mounting hole 110 opposite to the first sidewall 110a1 and a fourth sidewall 110a4 of the sensor mounting hole 110 opposite to the third sidewall 110a3.

Figure 7:
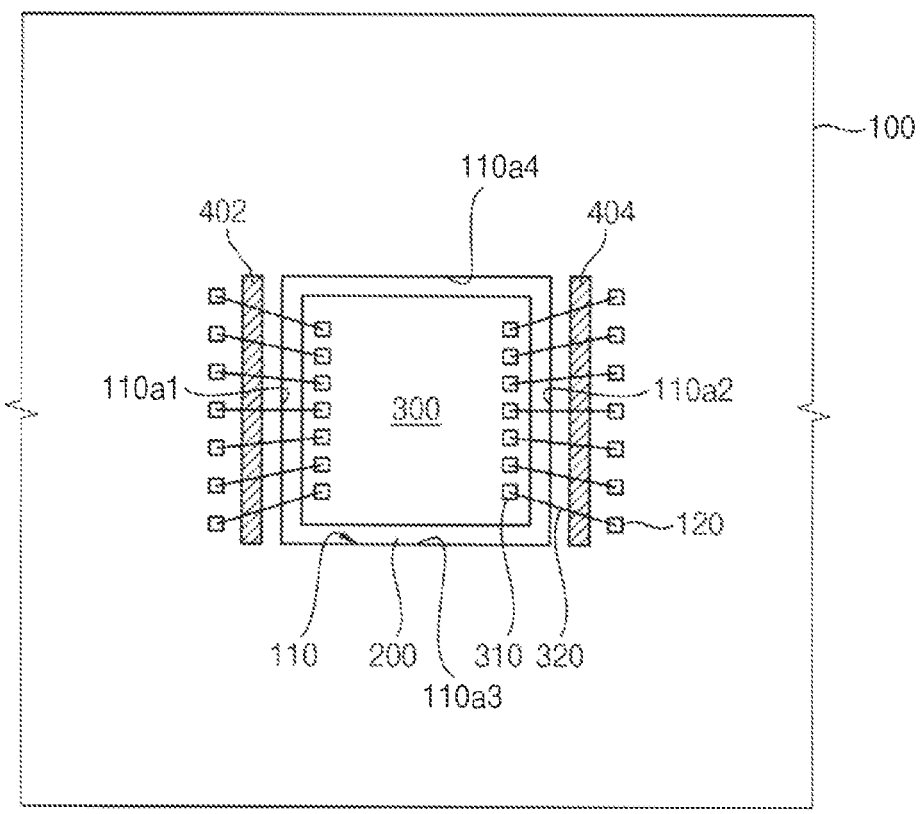

Referring to FIG. 7, a reinforcing pattern may include first and second support patterns 402, 404 which are spaced apart from each other along a perimeter of the sensor mounting hole 110. The first support pattern 402 may extend along a first sidewall 110a1 of the sensor mounting hole 110. The second support pattern 404 may extend along a second sidewall 110a2 of the sensor mounting hole 110 opposite to the first sidewall 110a1.

Figure 8:
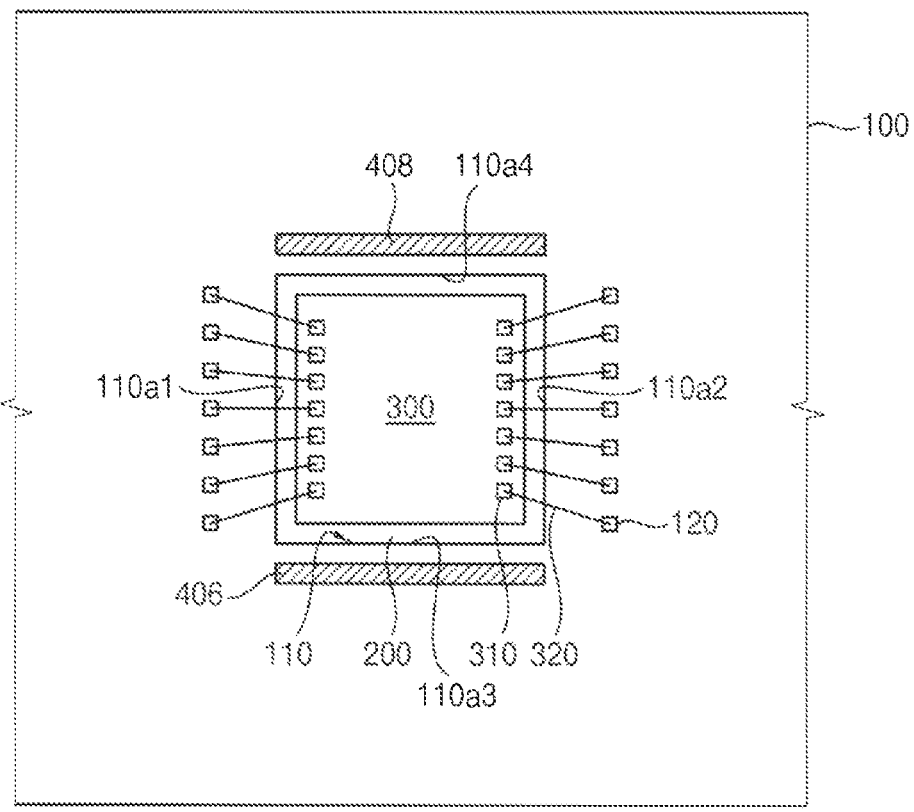

Referring to FIG. 8, a reinforcing pattern may include third and fourth support patterns 406, 408 which are spaced apart from each other along a perimeter of the sensor mounting hole 110. The third support pattern 406 may extend along a third sidewall 110a3 of the sensor mounting hole 110 adjacent to the first sidewall 110a1. The fourth support pattern 408 may extend along a fourth sidewall 110a4 of the sensor mounting hole 110 opposite to the third sidewall 110a3.

Figure 9:
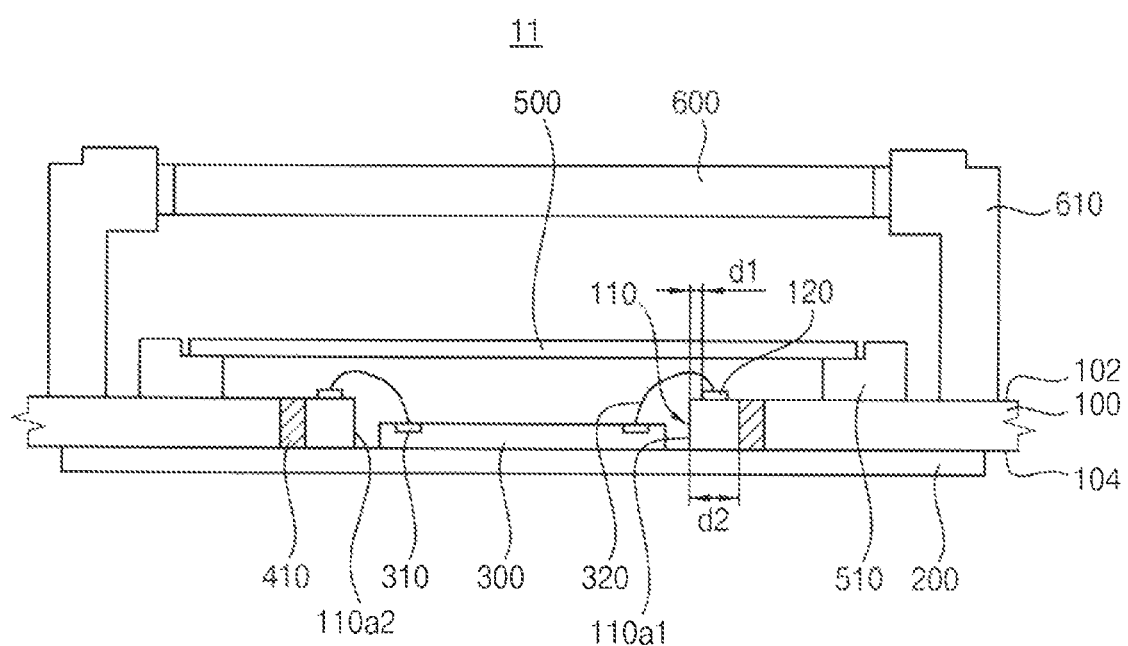
Figure 10:
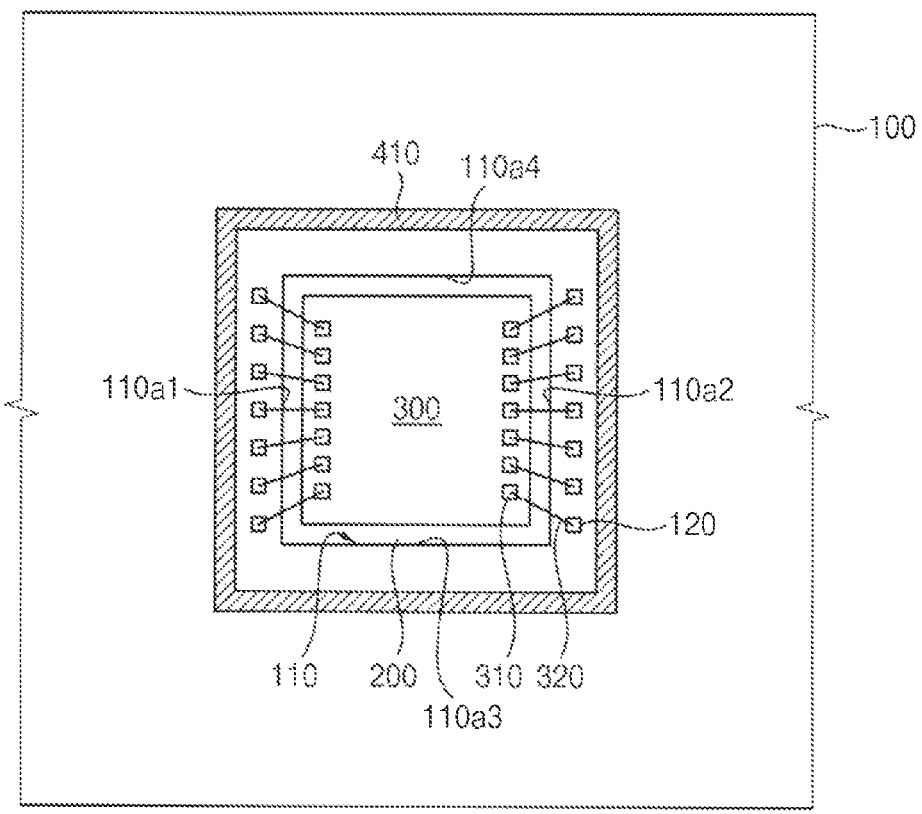

FIG. 9 is a cross-sectional view illustrating an image sensor module 11 in accordance with some example embodiments. FIG. 10 is a plan view illustrating an image sensor chip on a module substrate in FIG. 9. The image sensor module 11 may be substantially the same as or similar to the image sensor module 10 as described with reference to FIGS. 1 to 4, except for an arrangement of a reinforcing pattern. Thus, same reference numerals will be used to refer to the same or like elements and any further repetitive explanation concerning the above elements will be omitted.

Referring to FIGS. 9 and 10, a reinforcing pattern 400 may be formed in a module substrate 100 adjacent to a sensor mounting hole 110 and extend in at least one direction. The sensor mounting hole 110 may have a rectangle or square shape, and the reinforcing pattern 400 may have a ring shape extending around the sensor mounting hole 110.

In particular, a plurality of chip pads 310 may be arranged on an active surface of an image sensor chip 300 along first and second side portions opposite to each other, and a plurality of substrate pads 120 may be formed on an upper surface 102 of the module substrate 100 along first and second sidewalls 110a1 and 110a2 of the sensor mounting hole 110 corresponding to the respective chip pads 310.

The substrate pad 120 may be spaced apart from a sidewall (e.g., first sidewall 110a1) of the sensor mounting hole 110 by a first distance d1a, and the reinforcing pattern 400 may be spaced apart from the sidewall of the sensor mounting hole 110 by a second distance d2a greater than the first distance d1a. That is, the reinforcing pattern 400 may be arranged to be further from the sidewall (e.g., first sidewall 110a1) of the sensor mounting hole 110 than the substrate pad 120.

Figure 11:
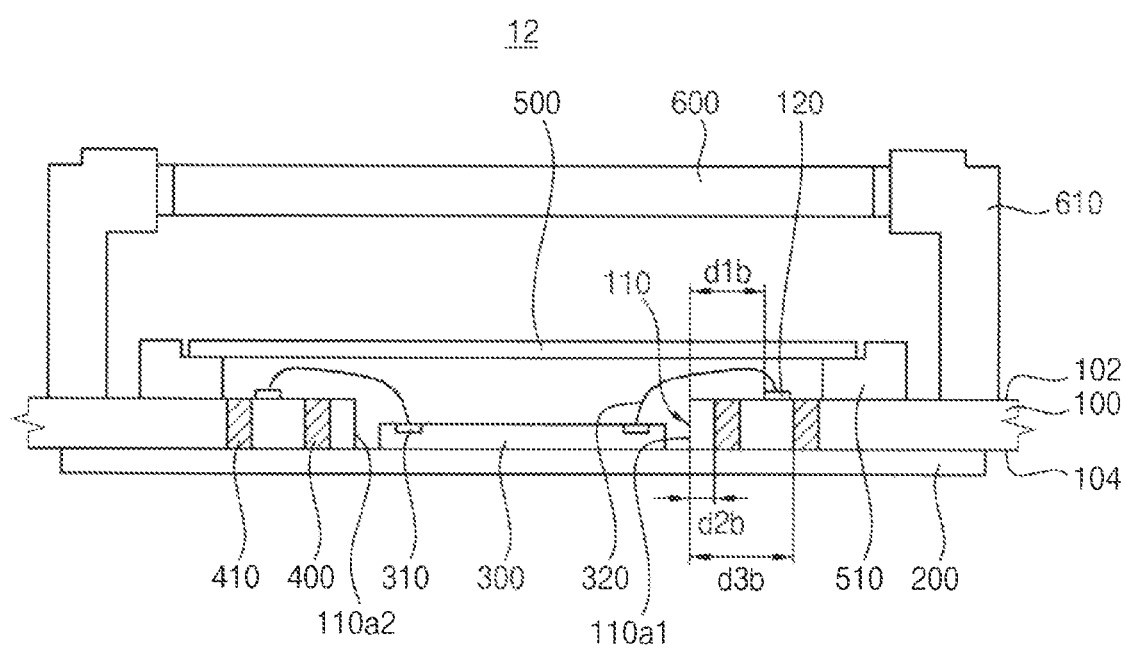
Figure 12:
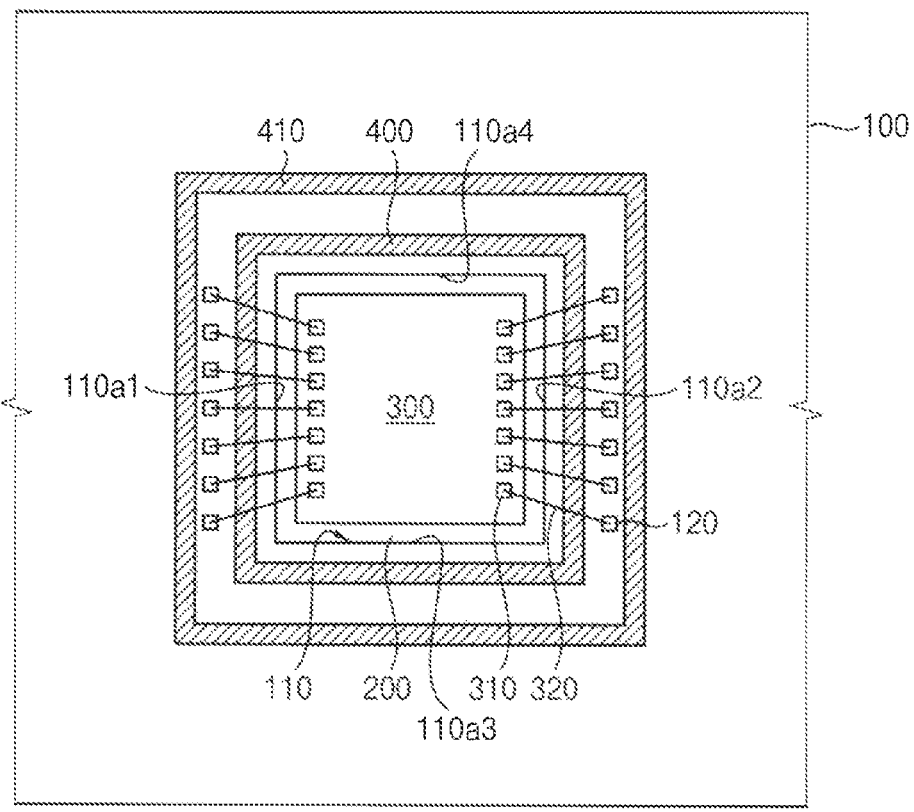

FIG. 11 is a cross-sectional view illustrating an image sensor module in accordance with some example embodiments. FIG. 12 is a plan view illustrating an image sensor chip on a module substrate in FIG. 11. The image sensor module 12 may be substantially the same as or similar to the image sensor module 10 as described with reference to FIGS. 1 to 4, except for an additional reinforcing pattern. Thus, same reference numerals will be used to refer to the same or like elements and any further repetitive explanation concerning the above elements will be omitted.

Referring to FIGS. 11 and 12, an image sensor module 12 may include first and second reinforcing patterns 400, 410 formed in at least a portion of a module substrate 100 to extend around a sensor mounting hole 110. The second reinforcing pattern 410 may be arranged to be further away from a sidewall (e.g., 110a1) of the sensor mounting hole 110 than the first reinforcing pattern 400. The first reinforcing pattern 400 may surround the sensor mounting hole 110, and the second reinforcing pattern 410 may surround the first reinforcing pattern 400.

A substrate pad 120 may be spaced apart from a sidewall (e.g., first sidewall 110a1) of the sensor mounting hole 110 by a first distance d1b, the first reinforcing pattern 400 may be spaced apart from the sidewall (e.g., first sidewall 110a1) of the sensor mounting hole 110 by a second distance d2b less than the first distance d1b, and the second reinforcing pattern 410 may be spaced apart from the sidewall (e.g., first sidewall 110a1) of the sensor mounting hole 110 by a third distance d3b greater than the first distance d1b. That is, the first reinforcing pattern 400 may be arranged to be closer to the sidewall (e.g., first sidewall 110a1) of the sensor mounting hole 110 than the substrate pad 120, and the second reinforcing pattern 410 may be arranged to be further from the sidewall (e.g., first sidewall 110a1) of the sensor mounting hole 110 than the substrate pad 120.

Figure 13:
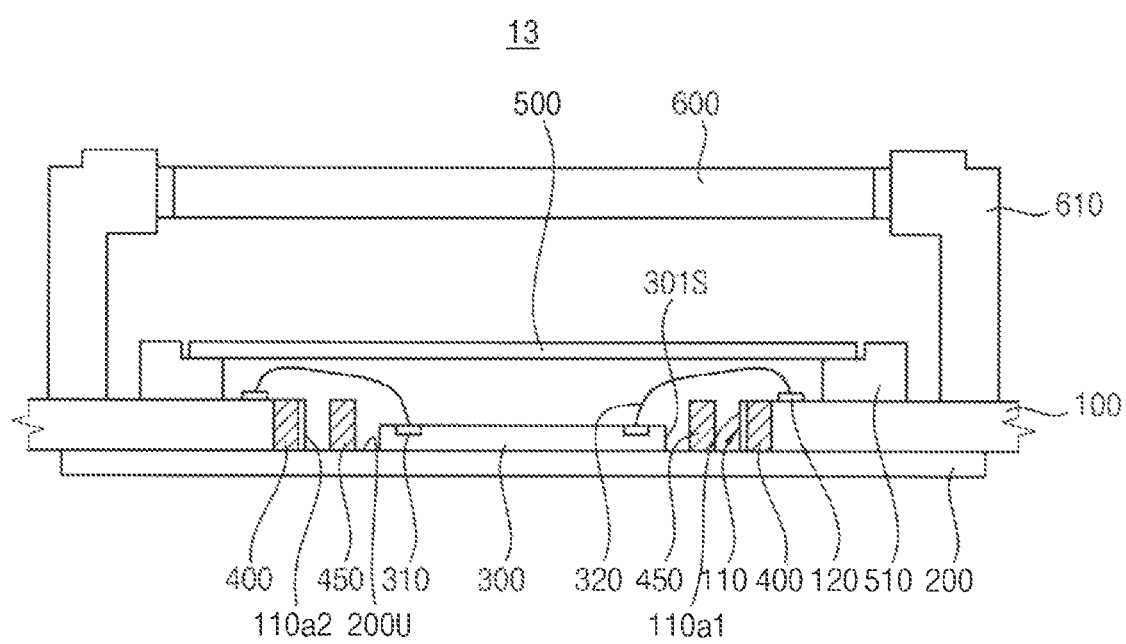
Figure 14:
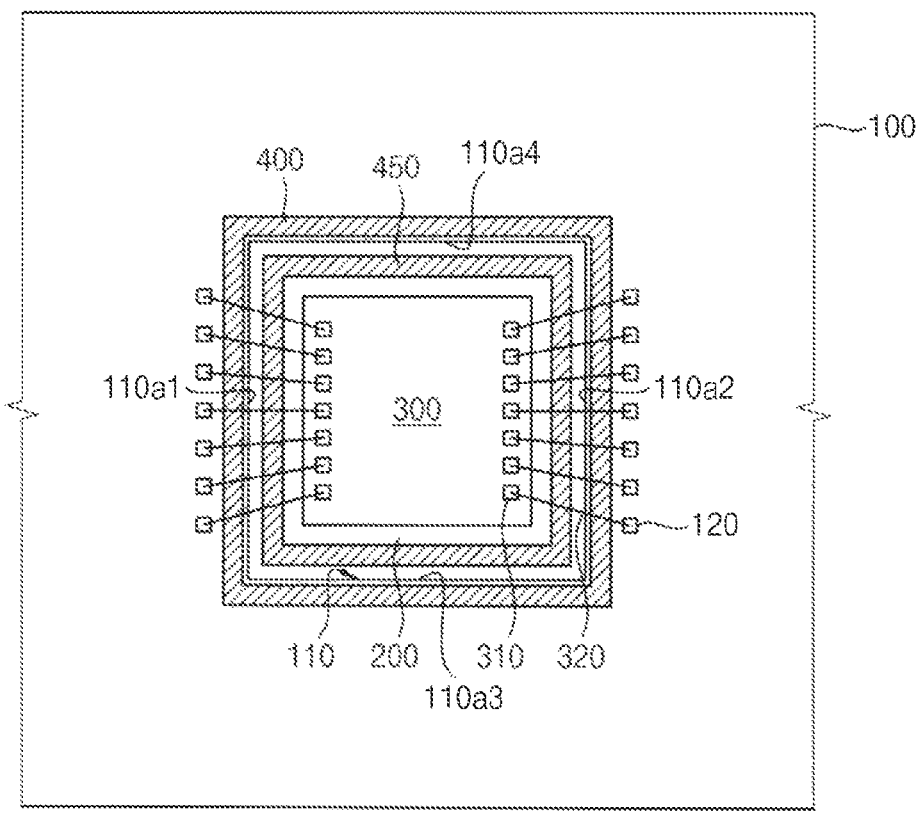

FIG. 13 is a cross-sectional view illustrating an image sensor module in accordance with some example embodiments. FIG. 14 is a plan view illustrating an image sensor chip on a module substrate in FIG. 13. The image sensor module 13 may be substantially the same as or similar to the image sensor module 10 as described with reference to FIGS. 1 to 4, except for an additional reinforcing pattern. Thus, same reference numerals will be used to refer to the same or like elements and any further repetitive explanation concerning the above elements will be omitted.

Referring to FIGS. 13 and 14, an image sensor module 13 may further include an auxiliary reinforcing pattern 450 on a reinforcing plate 200 within a sensor mounting hole 110.

The auxiliary reinforcing pattern 450 may extend around an image sensor chip 300 on an upper surface 200U of the reinforcing plate 200. The auxiliary reinforcing pattern 450 may be arranged between an outer surface of the image sensor chip 300 (e.g., 301S) and a sidewall of the sensor mounting hole 110 (e.g., 110a1) on the upper surface 200U of the reinforcing plate 200. The auxiliary reinforcing pattern 450 may have a ring shape extending in a perimeter of the sensor mounting hole 110. Alternatively, the auxiliary reinforcing pattern 450 may include a plurality of support patterns which are spaced apart from each other along a perimeter of the image sensor chip 300.

The auxiliary reinforcing pattern 450 may include a metal material. The auxiliary reinforcing pattern 450 may include a metal material the same as or different from the reinforcing pattern 400.

Thus, the auxiliary reinforcing pattern 450 may support the reinforcing plate 200 which is vulnerable to deformation when assembled for an electronic device, to thereby improve a backside strength.

An image sensor module in accordance with some example embodiments may be used in digital devices such as digital camera, camera phone, etc.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the inventive concepts. Accordingly, all such modifications are intended to be included within the scope of example embodiments as defined in the claims.

What is claimed is:

1. A substrate structure for an image sensor module, the substrate structure comprising:

a module substrate including a sensor mounting hole;

a reinforcing plate on a lower surface of the module substrate, the reinforcing plate covering the sensor mounting hole;

an image sensor chip on the reinforcing plate within the sensor mounting hole, such that an upper surface of the image sensor chip is exposed by the module substrate; and a reinforcing pattern in the module substrate, the reinforcing pattern adjacent to the sensor mounting hole and extending within the module substrate in at least one direction, wherein the reinforcing pattern includes a plurality of stacked wiring patterns in a wiring layer of the module substrate.

2. The substrate structure of claim 1, wherein the reinforcing pattern has a ring shape such that the reinforcing pattern extends around the sensor mounting hole within the module substrate.

3. The substrate structure of claim 1, wherein the reinforcing pattern includes a plurality of support patterns, the plurality of support patterns spaced apart from each other along an entirety of a perimeter of the sensor mounting hole, such that the plurality of support patterns are isolated from direct contact with each other.

4. The substrate structure of claim 1, wherein the reinforcing pattern includes a pair of support patterns, the pair of support patterns extending within opposing first and second sidewalls of the sensor mounting hole, respectively.

5. The substrate structure of claim 1, wherein the reinforcing pattern is in a through hole which extends through the module substrate, such that the reinforcing pattern extends through the module substrate.

6. The substrate structure of claim 1, wherein the reinforcing pattern and a wiring of the module substrate include a common material.

7. The substrate structure of claim 1, wherein the reinforcing pattern and a wiring of the module substrate include different materials.

8. The substrate structure of claim 1, further comprising:
a plurality of substrate pads on an upper surface of the module substrate, the plurality of substrate pads extending along a sidewall of the sensor mounting hole, the plurality of substrate pads configured to be electrically connected to the image sensor chip.

9. The substrate structure of claim 8, wherein
each substrate pad of the plurality of substrate pads is isolated from direct contact with the sidewall of the sensor mounting hole by a first distance,
the reinforcing pattern is isolated from direct contact with the sidewall of the sensor mounting hole by a second distance, and
the second distance is greater than the first distance.

10. A substrate structure for an image sensor module, the substrate structure comprising:
a module substrate having an upper surface and a lower surface, the module substrate including a sensor mounting hole;
a reinforcing plate on the lower surface of the module substrate, the reinforcing plate covering the sensor mounting hole;

an image sensor chip on the reinforcing plate within the sensor mounting hole, such that an upper surface of the image sensor chip is exposed by the module substrate; and a reinforcing pattern in at least a portion of the module substrate, the reinforcing pattern extending within the module substrate around the sensor mounting hole, wherein the reinforcing pattern includes a plurality of stacked wiring patterns in a wiring layer of the module substrate.

11. The substrate structure of claim 10, wherein the reinforcing pattern has a ring shape such that the reinforcing pattern extends around the sensor mounting hole within the module substrate.

12. The substrate structure of claim 10, wherein the reinforcing pattern includes a plurality of support patterns, the plurality of support patterns spaced apart from each other along an entirety of a perimeter of the sensor mounting hole, such that the plurality of support patterns are isolated from direct contact with each other.

13. The substrate structure of claim 10, further comprising:
a plurality of substrate pads on the upper surface of the module substrate, each substrate pad of the plurality of substrate pads further from a sidewall of the sensor mounting hole than the reinforcing pattern.

14. An image sensor module, comprising:
a module substrate having an upper surface and a lower surface, the module substrate including a sensor mounting hole;
a reinforcing plate on the lower surface of the module substrate, the reinforcing plate covering the sensor mounting hole;
an image sensor chip on the reinforcing plate within the sensor mounting hole, such that an upper surface of the image sensor chip is exposed by the module substrate;
a reinforcing pattern in at least a portion of the module substrate, the reinforcing pattern extending within the module substrate around the sensor mounting hole, wherein the reinforcing pattern includes a plurality of stacked wiring patterns in a wiring layer of the module substrate; and
an optical system on the upper surface of the module substrate, the optical system configured to focus light received from an external object to the image sensor chip.

15. The image sensor module of claim 14, further comprising:
an optical filter extending over the module substrate such that the optical filter covers the image sensor chip; and
a bracket configured to support fixedly the optical filter.

16. The image sensor module of claim 14, wherein the reinforcing plate includes a thermal conductive material.

17. The image sensor module of claim 14, wherein the upper surface of the image sensor chip is proximate to the reinforcing plate in relation to the upper surface of the module substrate.

18. The image sensor module of claim 14, wherein the reinforcing pattern has a ring shape such that the reinforcing pattern extends around the sensor mounting hole within the module substrate.

* * * * *